Aug. 6, 1968 FRITZ-WERNER BEYERLEIN 3,395,447

METHOD FOR MASS PRODUCING SEMICONDUCTOR DEVICES

Filed March 25, 1965 2 Sheets-Sheet 1

United States Patent Office 3,395,447

Patented Aug. 6, 1968

3,395,447

METHOD FOR MASS PRODUCING SEMICONDUCTOR DEVICES

Fritz-Werner Beyerlein, Munich, Germany, assignor to Siemens Aktiengesellschaft, a corporation of Germany Filed Mar. 25, 1965, Ser. No. 442,759
Claims priority, application Germany, Mar. 26, 1964, S 90,233, S 90,234
10 Claims. (Cl. 29—588)

ABSTRACT OF THE DISCLOSURE

A method for the mass production of semiconductor circuit device units includes alloying semiconductor bodies in spaced disposition to an elongated band substrate structure. Connecting wires are disposed coextensively with the structure in a plane coplanar with the ends of the leads extending upwardly from the semiconductor bodies. The leads are secured to the wires to form electrically conductive junctions between them. The wires are secured to the structure in the spaces between the semiconductor bodies. Each of the semiconductor bodies, its contact leads and junctions are individually enveloped in encapsulating material. The discrete encapsulated units are then separated from the structure by severing the band and the wire on both sides of the capsule.

*Description of the invention*

My invention relates to a method for the mass production of semiconductor devices. More particularly, it relates to such method which is particularly efficacious in the production of microsemiconductor devices.

In the mass production of microsemiconductor devices, assembly line techniques employing a conveyor belt have proven to be impracticable because of the inherent mechanical instability of the structures comprising the semiconductor device. Thus in such techniques it has been necessary to use auxiliary devices such as fixtures, prefabricated encapsulating housings, and the like.

Accordingly, it is an important object of this invention to provide an improved method for mass producing microsemiconductor circuit components.

It is a further object to provide a method in accordance with the preceding object suitable for use in the mass production of solid state circuits.

These objects are achieved by utilizing as a conveyor belt for the semiconductor devices and circuits, a carrier structure which consists of a suitable electrical contact material and which in the finished semiconductor devices serves as one of the electrical contacts and leads thereof. In addition, connecting wires are utilized which are disposed in a given spatial relationship with respect to the aforesaid carrier structure and which are joined at spaced intervals to the carrier structure. In carrying out the method prepared semiconductor device and circuit units with appropriate electrode contact wire leads extending therefrom are bonded to the carrier structure at substantially uniformly spaced intervals by suitable techniques such as alloying, soldering, gluing, etc., the extent of the spacing being determined by the dimensions of the semiconductor devices, and the contact leads from the semiconductor units are joined to the connecting wires. The respective semiconductor units and the junctions of their contact leads with the connecting wires are then enveloped in a low melting encapsulating material, the encapsulating material which is utilized suitably being one which has a low-melting point but which is solid at the operating temperatures of the semiconductor device. After such encapsulations, the individual encapsulated semiconductor device units are provided by cutting the carrier structure in the spaces between the semiconductor device units whereby each unit which results includes the aforesaid semiconductor device encapsulated together with the junctions of its contact leads and the connecting wires bonded to a portion of the carrier structure with the connecting wires joined directly to the carrier portion structure.

Generally speaking and in accordance with the invention, there is provided a method for mass producing semiconductor device units comprising firmly bonding in spaced disposition semiconductor bodies having electrode contacts thereon to an elongated substrate structure comprising an electrical contact material, respectively electrically conductively joining the electrodes of each of the semiconductor bodies to the substrate structure to provide respective junctions associated with each of the semiconductor bodies, and enveloping each of the bodies and its junctions in an encapsulating material.

The foregoing and more specific objects and features of my invention will be apparent from, and will be mentioned in the following description of the method for mass producing semiconductor device units according to the invention shown by way of example in the accompanying drawings, wherein.

Referring now to FIGS. 1 to 4, there is shown an embodiment for carrying out the method of the invention in which the carrier substrate structure which is utilized suitably comprises a band of iron-cobalt-nickel alloy having a thin coating thereon of a noble metal, gold being particularly suitable as the noble metal. The connecting wires also suitably consist of a noble metal which are suitably joined to the carrier structure by spot welding, for example, at spaced intervals as determined by the dimensions of the semiconductor bodies of the semiconductor devices being produced.

Figure 1:
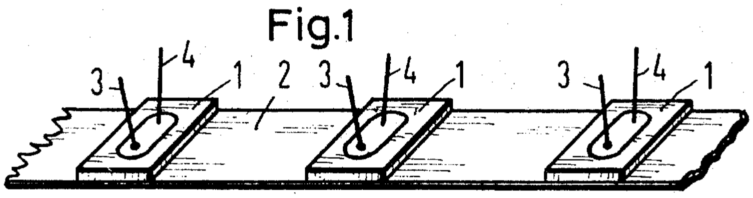
FIGS. 1 to 4 are perspective views which schematically show progressively occurring stages in one embodiment of a method carried out in accordance with the principles of the invention.

Thus, as shown in FIGS. 1 to 4, which illustrate stages in a method suitable for producing microplanar transistors, the semiconductor bodies 1 thereof have lead wires 3 and 4, i.e., contact making wires, extending substantially vertically from their electrode contacts. The semiconductor bodies 1 are alloyed to a carrier substrate structure 2 which is suitably an elongated band of the aforesaid gold coated iron-cobalt-nickel alloy having a width at least wide enough to accommodate said semiconductor bodies. The semiconductor bodies 1 are disposed on the structure 2 in substantially equispaced relationship, the spacing between individual semiconductor bodies being suitably determined by the dimensions thereof, the working space required in mass production techniques, etc. FIG. 1 illustrates the foregoing embodiment.

Figures 2, 3, 4:
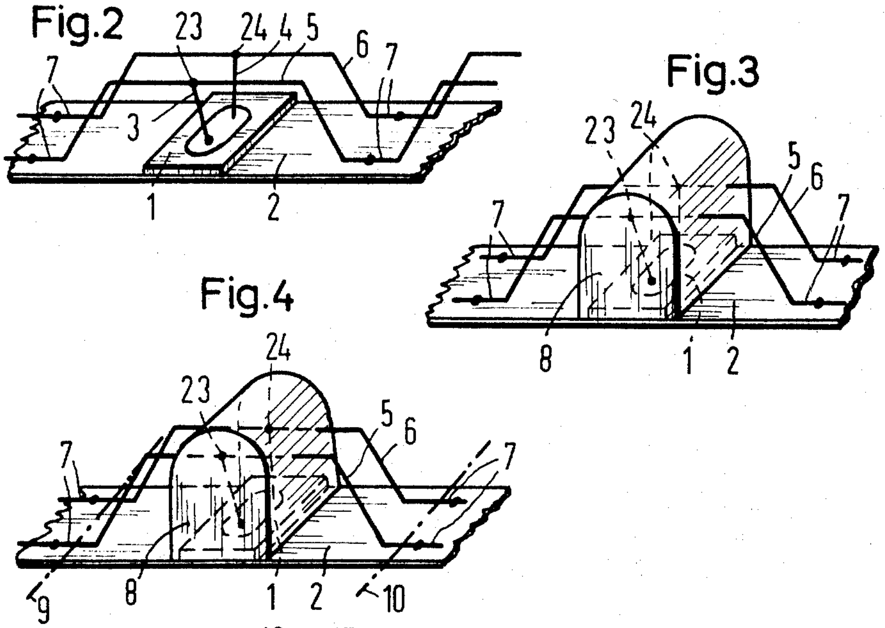

FIG. 2 shows connecting wires 5 and 6 which are suitably disposed in a plane substantially parallel to the structure 2 with the semiconductor bodies thereon and extending coextensively with said structure. The wires 5 and 6 are spaced from each other so that they can readily be secured to respective contact making wires 3 and 4, at junction points 23 and 24, such securements being effected by suitable known methods such as thermal compression, etc. A further step in the method comprises the spot welding of the wires 5 and 6 to the structure 2 on both sides of a semiconductor body 1 at points 7.

The semiconductor body 1, the contact making wires 3 and 4 and the junction 23 and 24 of the wires 3 and 4 with the wires 5 and 6 respectively, as shown in FIG. 3, are then enveloped in a suitable encapsulating compound such as an epoxy resin whereby the mechanically relatively unstable structures such as wire junctions, wires, etc., in each semiconductor device unit are protected from physically disruptive and chemically corrosive phenomena. The configuration of the encapsulation 8 may be chosen in accordance with the geometry desired in the completed stuctures.

There remains thereafter only the separation of the completed units from each other, such separation being suitably effected by sawing at points 9 and 10 for example, as shown in FIG. 4. Thereafter, if it is desired, the devices may be coated with a colored lacquer for enabling ready identification and classification thereof.

The inventive method provides the advantage that all of the operations therein, from the alloying of the semiconductor bodies 1 onto the carrier substrate structure 2 through the final step of completion of the semiconductor device unit, can be carried out without any risk of destruction or damage of the device because of mechanical stresses. It further provides the advantage of consistency in the finished devices, since any fluctuations in the physical properties as occurring in such devices at most are slight, because the manufacturing conditions for the individual elements are identical through the employment of a conveyor belt principle.

As encapsulating materials, castable resins such as epoxy resins, silicone resins, polyester resins, and the like are suitable as are low melting glasses. It is not material whether thermosetting of thermoplastic resins are utilized, the important requirement thereof being that they become liquid at a relatively low temperature, particularly below the alloying temperature of the semiconductor bodies 1 to carrier structure 2, but that they be solid at the normal operating temperatures of the semiconductor devices and thereby assure the mechanical stability of the device.

Figure 5:
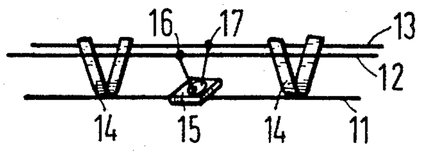
FIGS. 5 to 7 are views which schematically depict progressively occurring stages in another embodiment of the invention.
Figure 6:
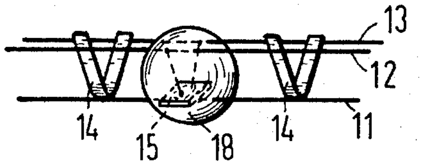
Figure 7:
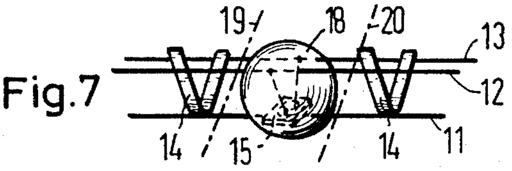

FIGS. 5 to 7 show different stages in an embodiment of the inventive method which is carried out by utilizing a wire-shaped carrier substrate structure which also suitably comprises an iron-nickel-cobalt alloy having a gold layer thereon of about 0.1 micron thickness. In this embodiment, the connecting wires are positioned to be united with the electrode contact leads extending from the semiconductor bodies by utilizing spaced substantially U-shaped straps, the apices of which are secured to the wire carrier structure and the spaced connecting wires extending coextensively with, and disposed in a horizontal plane spaced from the carrier structure, are maintained properly spaced from each other by the straps. In this arrangement, the straps are retained in a comparatively fixed disposition with respect to the carrier structure and in position to be readily joined by thermal compression or other suitable means to the electrode contact leads extending from semiconductor bodies positioned on and secured to the carrier structure, preferably in substantially uniformly spaced relationship.

Thus, referring to FIGS. 5 to 7, as shown in FIG. 5, the wire carrier structure 11 comprising the iron-nickel-cobalt alloy having the 0.1 micron gold layer thereon has sécured thereto, suitably by alloying, horizontally disposed semiconductor bodies, such as bodies 15, preferably in substantial uniform spaced relationship, only one semiconductor body 15 being shown for convenience of illustration. U-shaped straps 14 which suitably comprise a relatively strong rigid material are secured at their apices to the wire carrier structure 11. The spaced parallel connecting wires 12 and 13 which lie disposed in a substantially horizontal plane spaced from the structure 11 and run coextensively therewith are maintained properly spaced from each other by the end portions of the arms of the straps 14 whereby they are conveniently positioned for being secured at points 16 and 17 respectively with the ends of the electrode contact leads which extend upwardly from the semiconductor bodies 15. The described proper connecting wire spacing is determined by the apex angle of the U-shaped strap and the length of the arms thereof.

Thereupon, as shown in FIG. 6, the semiconductor body 15 together with its electrode contact leads and junctions 16 and 17 are suitably enveloped in the encapsulating material to provide a semiconductor device unit capsule 18 for rendering the unit mechanically stable.

After capsule 18 has been duly and properly hardened, the individual semiconductor device unit may be provided by severing it from the connecting wires 12 and 13 and the wire carrier structure 11 such as by cutting or sawing at regions 19 and 20, as shown in FIG. 7. The unit can then be further coated, if desired, with a colored lacquer or like material for ready recognition, classification, etc.

By utilizing the method whose various stages are depicted in FIGS. 5 to 7, the need for using preformed encapsulating structures and fixtures for maintaining the connecting wires 12 and 13 in fixed parallel relationship is dispensed with. Thus, by maintaining the connecting wires in their desired parallel disposition by holding straps 14 which may suitably be secured to the carrier structure 11 at their apices by a simple technique such as spot welding, and, thereafter, enveloping the necessary components of the semiconductor units in the encapsulating material, the procedure for producing the encapsulated units is greatly simplified as compared to prior art methods for producing like units.

FIGS. 8 to 11 depict stages in an embodiment of the inventive method in which there is utilized a carrier substrate structure comprising an elongated band suitably comprising the iron-nickel-cobalt alloy with the 0.1 micron gold layer thereon. The band has the semiconductor bodies alloyed thereto and disposed preferably in uniformly spaced relationship in a substantially centrally disposed strip. The longitudinally running portions of the band on either side of the line of semiconductor bodies are bent up at about right angles to the central strip to provide a U-shaped band having the semiconductor bodies lying on and alloyed to the base thereof, the edges of the semiconductor bodies preferably being in intimate contact with the upright legs of the U. The electrode contact leads extending upwardly from the semiconductor bodies are secured to such legs near the top thereof and the semiconductor bodies, with their associated contact leads and the junctions thereof to the upright legs of the U-formed band are suitably encapsulated to produce the semiconductor device units.

Figures 8, 9, 10, 11:
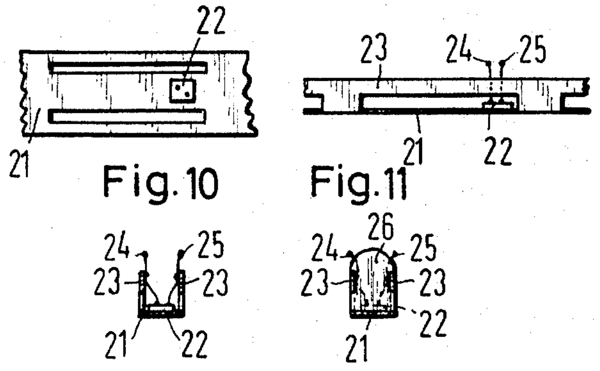
FIGS. 8 to 11 are views which schematically depict another embodiment of the invention.
Figure 12:
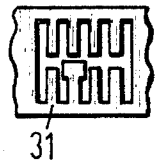
FIGS. 12 to 15 are views which schematically illustrate progressively occurring stages in a further embodiment of the invention.
Figure 13:
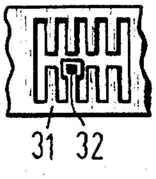

Thus, referring to FIGS. 8 to 11, in FIG. 8 there is shown the carrier substrate band 21 having alloyed thereto the semiconductor bodies 22, only one of which is shown for convenience of depiction and explanation, disposed along a central area longitudinally running strip of said band, preferably in uniformed spaced relationship. The band 21 may suitably be provided with longitudinally disposed slots which enable the ready bending up at right angles of the side portions of said band.

FIG. 9 shows a side elevation of the arrangement of FIG. 8 with the side portions bent up at right angles, said side portions being designated with the numeral 23. The electrode contact leads 24 and 25 are shown extending upwardly from the semiconductor body 22.

FIG. 10 shows in cross section, the arrangement of FIG. 9. It is seen therein that the contact lead wires 24 and 25 rest against the inner surfaces of the upright arms 23 of structure 21 and are suitably secured thereto by spot welding near the edges thereof, the edges of the upright arms 23, in effect, serving the same function as the connecting wires shown in FIGS. 1 to 7. Thereafter, as shown in FIG. 11, the inner strip portion of the structure 21 carrying the semiconductor bodies 22, the edge portions of said structure having the contact leads 24 and 25 secured thereto, and portions of said contact leads 24 and 25 are all suitably enveloped, as described hereinabove, in an encapsulating material to provide the capsule 26 containing therein the semiconductor device unit. Thereafter, the unit is cut from the carrier structure 21 and may be coated with a colored varnish, lacquer or other suitable material by dipping or other convenient techniques.

FIGS. 12 to 15 depict stages in an embodiment of a method according to the invention which lends itself readily to the production of switching circuits either comprising only semiconductor components or a combination of semiconductor and conventional components. In this method, the carrier structure and the effective wire connections are both provided from a band of electrical contact material and the band has a pattern comprising a plurality of spaced parallel bars provided therein by a suitable technique such as punching, the array of the bars being laid out in accordance with the desired device unit to be produced. The punched out patterns may be chosen to include individual patterns suitable for several circuit components whereby the producing of a combination of a plurality of semiconductor components is enabled. Correspondingly, a combination of semiconductor and conventional circuit cmponents may be produced by this method.

Figure 14:
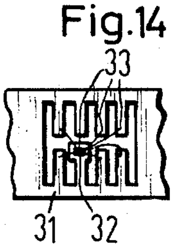
Figure 15:
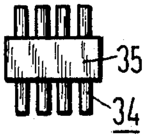

Thus, referring to FIGS. 12 to 15, FIG. 12 shows an elongated band substrate structure 31 which is suitably an iron-cobalt-nickel alloy coated with a thin layer, such as an 0.1 micron layer of gold and through which there are punched out spaced patterns suitable for making semiconductor switching circuits. To this punched out band 31, there are alloyed the semiconductor bodies 32, such as silicon switching circuits having the necessary electrode contact electrode dots thereon with leads therefrom (not shown). These contact dot leads are secured to the bars, resulting from the punching out of structure 31 according to the given pattern, at points 33, such securements suitably being effected by spot welding as shown in FIG. 14. Thereafter, the switching circuit semiconductor body together with a portion of the bars and the leads thereto from the semiconductor body 32 are enveloped in an encapsulating or potting material material. By suitably cutting away the superfluous material from the carrier substrate structure 31, there results, as shown in FIG. 15, a switching circuit unit 34 which, by virtue of capsule 35, is mechanically stable in response to externally applied stresses. Here as with the other semiconductor device units, as described hereinabove, the unit may be coated with a distinguished coat of varnish or colored plastic.

Figure 16:
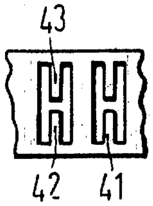
FIG. 16 shows an arrangement for making a semiconductor diode.
Figure 17:
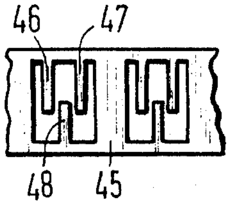
FIG. 17 shows an arrangement for making a transistor.
Figure 18:
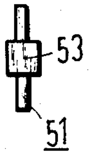
FIG. 18 shows a diode produced by the arrangement of FIG. 16.
Figure 19:
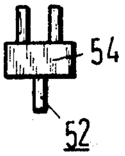
FIG. 19 shows a transistor produced by the arrangement of FIG. 17.

FIGS. 16 and 17 show punched out patterns in a carrier substrate band for producing diodes and transistors respectively. The pattern in band 41 in FIG. 16 is suitable for the production of diodes and is configured such that for contacting the electrodes of the semiconductor body thereon (not shown) two connection bars 42 and 43 are provided which eventuate as the diode electrode contact leads. The pattern in band 45 in FIG. 17 is suitable for producing transistors and to this end is configured such that three contact bars 46, 47 and 48 are provided for contacting the electrodes of the appropriate semiconductor body (not shown) which eventuate as the transistor electrode contact leads. The diode resulting from the pattern of FIG. 16 is suitably encapsulated to provide the device 51 of FIG. 18 having a capsule 53 in which the semiconductor body and electrode contacts thereof are enveloped. The transistor resulting from the pattern of FIG. 17 is suitably encapsulated to provide transistor 52 of FIG. 19 having a capsule 54 in which the semiconductor body and electrode contacts thereof are enveloped.

The method according to the invention is suitable for the manufacture of microelements, such as microplanar diodes, microplanar transistors, as well as to the manufacture and providing of contacts on solid state switching circuits. Thus, in accordance with the method illustrated in FIGS. 1 to 4, to make microplanar diodes thereby, only one connecting wire need be used since the carrier substrate structure provides the other contact lead. For providing leads for more complex units such as solid state switching circuits and other microcircuit components, it is merely necessary to provide as many connecting wires as there are electrodes on the semiconductor bodies.

The method illustrated by stages in FIGS. 12 to 15 is suitably utilized to produce switching networks comprising conventional circuit components or switching circuits which include a combination of conventional components and semiconductor components. In this situation, it is merely required that the pattern of lead connection bars produced from the carrier substrate structure band have dimensions commensurate with the circuit components' sizes.

It will be obvious to those skilled in the art, upon studying this disclosure, that methods for mass producing semiconductor device units according to my invention permit of a great variety of modifications and hence can be given embodiments other than those particularly illustrated and described herein without departing from the essential features of my invention and within the scope of the claims annexed hereto.

I claim:

1. A method for mass producing semiconductor circuit device units, comprising alloying in spaced disposition semiconductor bodies having leads extending upwardly therefrom to an elongated band substrate structure comprising an electrical contact material, disposing connecting wire means extending coextensively with said structure in a plane substantially coplanar with the end portions of said leads, securing said leads to said wire means to form electrically conductive junctions therebetween, securing said wire means to said structure in the spaces between said semiconductor bodies, individually enveloping each of said semiconductor bodies, their contact leads and said junctions in an encapsulating material to form a capsule therefor, and separating discrete encapsulated units from said structure by severing said band and said wire means on both sides of a capsule.

2. A method as defined in claim 1, wherein said substrate structure comprises a band of an iron-nickel-cobalt alloy material having a thin layer of a noble metal thereon and wherein said connecting wire means comprises wire means comprising a noble metal.

3. A method as defined in claim 1, wherein there is utilized as said substrate structure comprises a band of an iron-nickeil-cobalt alloy having a gold coating thereon.

4. A method as defined in claim 3, wherein said substrate structure comprises a band of an iron-nickel-cobalt alloy having a gold coating thereon having a thickness of about 0.1 micron.

5. A method as defined in claim 1, wherein said connecting wire means comprises a pair of substantially parallel spaced wires disposed in a plane substantially parallel to said subtrate structure and disposed near the ends of said leads to produce transistors.

6. A method as defined in claim 1, wherein said encapsulating material comprises a material which is normally solid at the temperatures of operation of said semiconductor device units and which is liquid at a temperature less than the temperatures at which said junctions are formed and said securements are effected.

7. A method as defined in claim 1, wherein said encapsulating material comprises a material selected from the group consisting of epoxy resins, silicone resins, polyester resins and low melting point glasses.

8. A method as defined in claim 1, wherein said junctions are formed by thermal compression.

9. A method for producing semiconductor circuit device units, comprising securing in spaced disposition and electrically conductive relation semiconductor bodies having leads extending upwardly therefrom to an elongated wire substrate structure comprising an electrical contact material securing the apices of U-shaped straps to said substrate structure in the spaces intermediate said semiconductor bodies respectively, disposing connecting wire means coextensive with said substrate structure subtantially parallel to said substrate structure and substantially coplanar with the end portions of the arms of said U-shaped straps and attached thereto for being maintained in proper geometric disposition by said straps, making electrically conducitve junctions between said leads and said connecting wire means, enveloping each of said semiconductor bodies and their associated leads and junctions thereof with said connecting wire means in an encapsulating material to provide respective capsules therefor, and severing said substrate structure and connecting wire means on both sides of said capsules.

10. A method as defined in claim 9 wherein said connecting wire means comprises a pair of spaced substantially parallel wires disposed substantially coplanarly with the end portions of the arms of said U-shaped straps, said wires being maintained uniformly spaced in accordance with the apex angles of said straps and the lengths of said arms.

References Cited

UNITED STATES PATENTS

| | | | |
|---|---|---|---|
| 2,962,058 | 11/1960 | Karnavas et al. | 29—591 X |
| 3,030,562 | 4/1962 | Maiden | 317—235 |
| 3,092,893 | 6/1963 | Cornelison et al. | 29—591 |
| 3,235,937 | 2/1966 | Lanzl et al. | 29—583 |
| 3,264,712 | 8/1966 | Hayashi et al. | 29—589 |

WILLIAM I. BROOKS, *Primary Examiner.*